United States Patent [19]

Morgan

[11] Patent Number: 5,281,868
[45] Date of Patent: Jan. 25, 1994

[54] MEMORY REDUNDANCY ADDRESSING CIRCUIT FOR ADJACENT COLUMNS IN A MEMORY

[75] Inventor: Donald Morgan, Boise, Id.

[73] Assignee: Micron Technology, Inc., Boise, Id.

[21] Appl. No.: 932,386

[22] Filed: Aug. 18, 1992

[51] Int. Cl.[5] .................... G06F 11/16; G11C 8/041
[52] U.S. Cl. ................... 307/441; 365/230.09;
365/236; 371/10.3; 307/219
[58] Field of Search .......... 307/441, 219, 202.1,
307/443; 365/200, 230.09, 236; 371/10.3

[56] References Cited

U.S. PATENT DOCUMENTS

| | | | |
|---|---|---|---|
| 4,233,682 | 11/1980 | Liebergot et al. | 307/219 |
| 4,633,429 | 12/1986 | Lewandowski et al. | 365/200 |
| 4,800,535 | 1/1989 | McAlpine | 365/200 |
| 4,847,810 | 7/1989 | Tagami | 307/219 |
| 5,157,628 | 10/1992 | Tani | 365/200 |

Primary Examiner—Edward P. Westin
Assistant Examiner—Benjamin D. Driscoll
Attorney, Agent, or Firm—Henry J. A. Charmasson; John D. Buchaca

[57] ABSTRACT

A circuit for automatically addressing and activating redundant circuits on an integrated circuit chip during testing, thereby improving efficient use of the space available for fuses and fuse pads. The circuit uses an integral number of fuses, whose blown and unblown combination represents $2^{**}n$ possible states. Each state represents the address of a particular circuit or set of circuits gone bad on the chip which needs to be replaced. By employing an incrementor, the logical address representing the circuit or set of circuits physically adjacent to the bad circuit is also replaced. More sophisticated incrementors may be used to address more than one adjacent circuit or sets of circuits having a non-incremental address.

16 Claims, 6 Drawing Sheets

MEMORY REDUNDANCY ADDRESSING CIRCUIT FOR ADJACENT COLUMNS IN A MEMORY

FIELD OF THE INVENTION

This invention relates to increasing the reliability and yield during manufacture of memory integrated circuit chips, specifically to the efficient use of the limited space available for fuse-activated redundant circuitry on such chips, and more particularly, to replacing multiple faulty memory locations using one independent redundancy element, and reducing the number of defect-signaling fuses.

BACKGROUND OF THE INVENTION

Semiconductor integrated circuits contain huge numbers of electronic devices such as diodes and transistors built onto a single crystal or chip, often made of silicon. Since these devices are so small, their operational integrity is very susceptible to imperfections or impurities in the crystal or introduced during fabrication. The failure of a single transistor in a circuit may render that circuit non-functional.

In order to circumvent this problem, the industry regularly builds redundant circuits on the same chip. Therefore, if a faulty circuit is discovered during testing, the faulty circuit can be disabled and its redundant circuit enabled. Often, this switching to a redundant circuit is accomplished by blowing certain fuses built into the circuitry of the chip. Those fuses signal the location of the defective element and enable a substitute element in a redundant circuit bank.

In the case of memory ICs, memory cells are usually arranged in rows and columns. Each memory cell is addressed by a particular row and column. By blowing the correct combination of fuses, circuitry which addresses the faulty element, such as a particular memory cell, a column or a row, is replaced with circuitry which addresses a corresponding redundant element.

When implementing redundancy schemes to salvage memory ICs containing defects, the limiting factor is often the number of defect-signaling fuses available for use. This is especially true when electrically blown fuses are used. Each fuse requires a probe pad large enough to connect an outside current source for blowing the fuse. By reducing the number of fuses needed, greater density and higher yields are possible.

Statistically, an impurity or imperfection causing the failure of a specific memory location is likely to affect the surrounding region in the crystal. Adjacent memory locations may have already gone bad, or their reliability has been seriously affected. Previously, the adjacent locations of dubious reliability would be tolerated or another set of fuses would be used to address another redundant memory location.

The usual set up for addressing one of 2n possible memory locations for replacement involves a set of n fuses. The combination of blown and unblown fuses allows for 2n possible states. Each state can represent one memory element, either cell, column or row, that is bad and must be replaced. It is also common practice to disregard the lower k significant bits of an address and use only n-k fuses. Each of the possible 2(n-k) states can replace a set of 2k elements.

Since memory circuit devices carry a limited number of redundant memory cells, typically configured as spare rows or columns, and the number of defect-signaling fuses must be limited, the reliability and yield of those circuits can be increased by judicious compromises.

SUMMARY OF THE INVENTION

The principal object of this invention is to increase the yield of operable integrated circuit memory devices by more efficiently using the space available for redundant circuits and their means for actuation. The secondary object is to provide means for replacing circuits physically close to faulty circuits as well as replacing the faulty circuits with a minimum number of fuses.

These and other objects are achieved by on-chip circuitry which interprets a combination of n fuses, blown and unblown, as meaning a specific memory location in need of replacement. This information, in the form of an address, is passed to an n bit incrementor circuit which calculates the address of the physically adjacent memory location. This information is passed to addressing circuits which address redundant circuits in place of those original circuits.

DESCRIPTION OF THE PREFERRED EMBODIMENTS OF THE INVENTION

Figure 1:
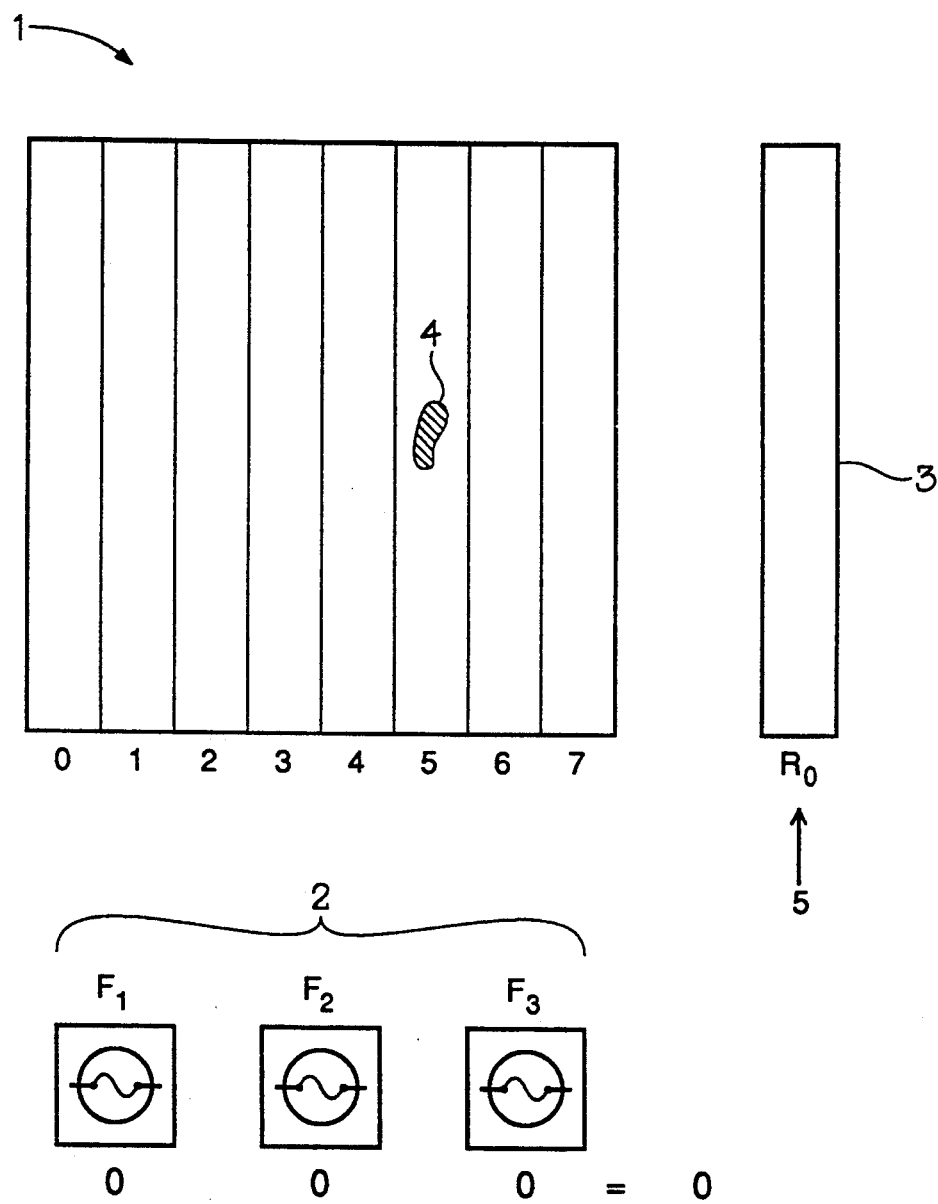
FIG. 1 is a block diagram representation of a memory array with its memory element layout in row and column format.
Figure 2:
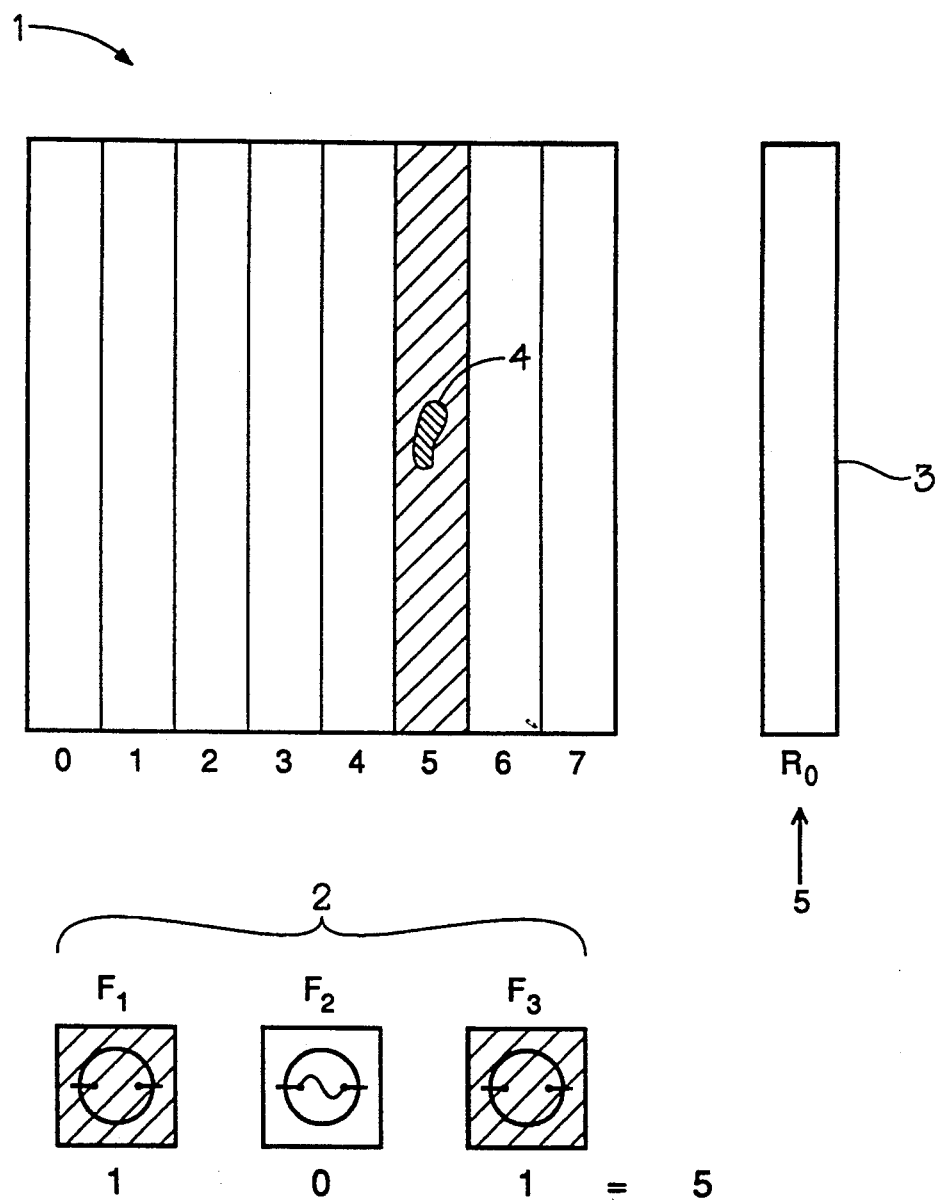
FIG. 2 is a block diagram representing the memory array with one faulty column being replaced by a redundant column.

Referring now to the drawing, FIG. 1 shows how memory cells are arranged in a row and column orientation in a typical DRAM array 1. Any memory location may be accessed by its n-bit row and n-bit column address where 2**(2n) is the total memory density or the density of memory segments addressed in parallel. Typically, entire rows or columns are replaced if a single faulty memory cell is discovered.

For illustration purposes, in this array (n)=3. The chip has eight rows and eight columns generating 64 total memory cells. A set of n fuses 2 are required to specify which of the columns are to be replaced with an available redundant column R0 3. An unblown fuse would correspond to a zero and a blown fuse to a one.

For example, suppose a defect or impurity 4 in the silicon wafer caused a memory location in column 5 to fail. Upon discovery, the testor would blow F1 and F3, leaving fuse F2 unblown. This three fuse "state" would correspond to the binary number 101 which would in turn correspond to the decimal number 5. Therefore, the redundant column R0 3 would now be accessed via the address 101, and the original column would be abandoned.

Some problems arise with this method of element replacement scheme. Since the n fuses correspond to $2^{**}n$ states, in our example there is no fuse state corresponding to no column being replaced. This requires an additional fuse for invoking redundancy or declaring one of the columns irreparable. Also, for whatever reason, memory elements physically adjacent to faulty memory elements experience a statistically higher degree of failure than those elements not adjacent to faulty elements.

Figure 3:
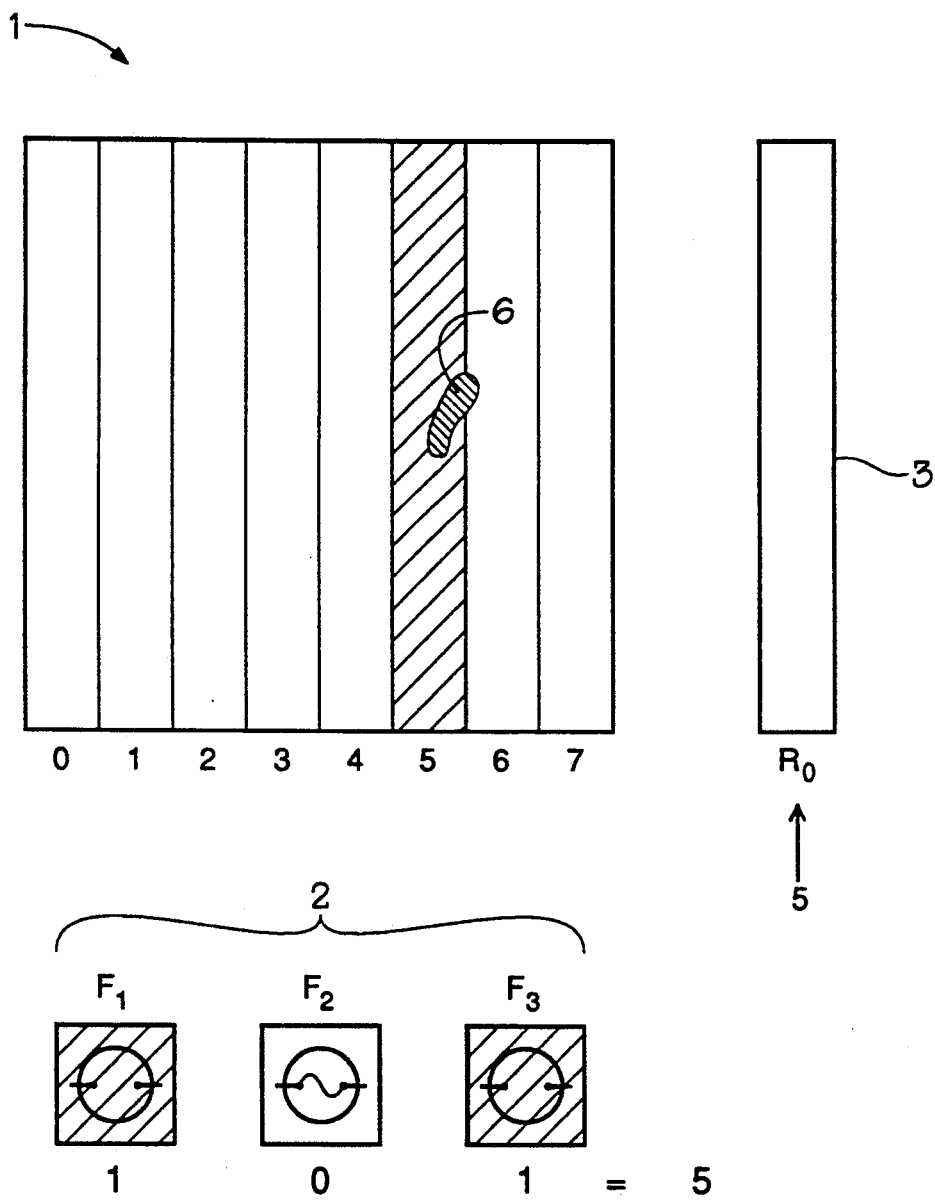
FIG. 3 is a block diagram representing the memory array with an enlarged impure region spilling into an adjacent column.

One possible explanation for adjacent element failure involves a larger defect or impurity 6 as seen in FIG. 3. To solve this problem, the prior art would require an additional set of defect-signaling fuses along with another redundant column.

Figure 4:
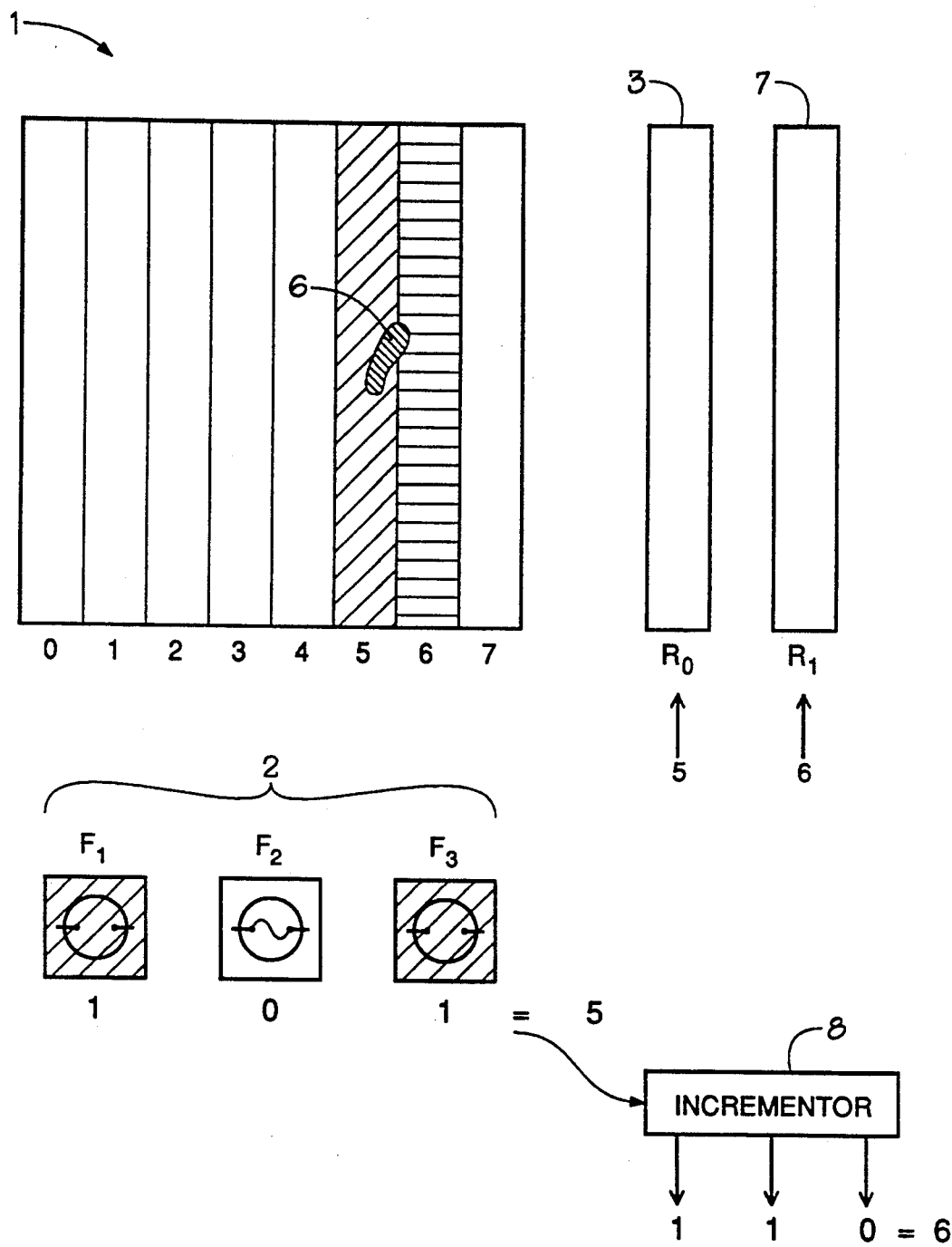
FIG. 4 is a block diagram representing a memory array with its faulty column and an adjacent column being replaced with only one set of fuses and an incrementor.

With the addition of a second redundant column R1 7 as seen in FIG. 4, the invention attacks this problem by automatically replacing physically adjacent elements while still retaining the same number of fuses. By sending the fuse state representing column 5 to a 3-bit add 1 incrementor 8, the state for the column 6, 110 is generated. In this scenerio all signals normally routed to column 5's address would be routed to redundant element R0. Likewise, those signals intended for memory element column 6 would be routed to redundant element R1 7.

This also solves the problem of no fuse state signifying non-replacement. The last column will always be replaced by using the fuse state for the next-to-last column. Therefore, there is no need for a fuse state to signify the last column exclusively as required in the prior art. In other words, since two columns are always replaced for each state, this leaves one extra state which may be interpreted as the "no replacement" state.

Figure 5:
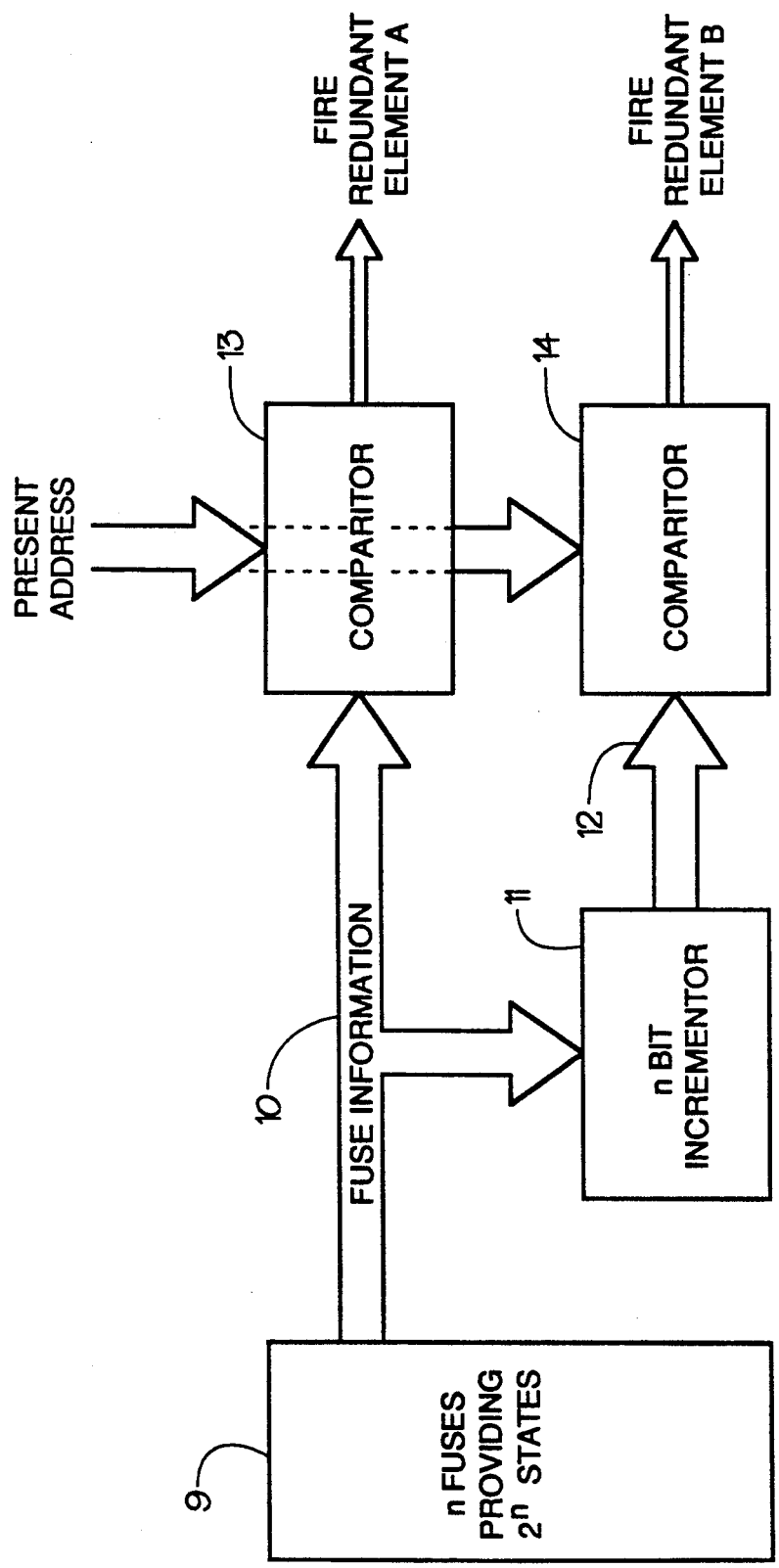
FIG. 5 is a flow chart diagram of the simplest embodiment of the invention.

Referring now to FIG. 5, the invention comprises a set of n fuses 9 providing $2^{**}n$ possible states. Each state corresponds to a specific memory element (column in the example) which is to be replaced with an available redundant memory element. This state information 10 which represents the address of the defective element is sent to an n-bit incrementor 11. Here, the n-bit address will be incremented by a predetermined factor m thereby generating the address of the physically adjacent element. In effect, the incrementor calculates state information corresponding to the physically adjacent memory location 12. This information is then passed to a pair of comparators 13 and 14 which adjust any incoming address to be routed to its associated redundant memory element.

Figure 6:
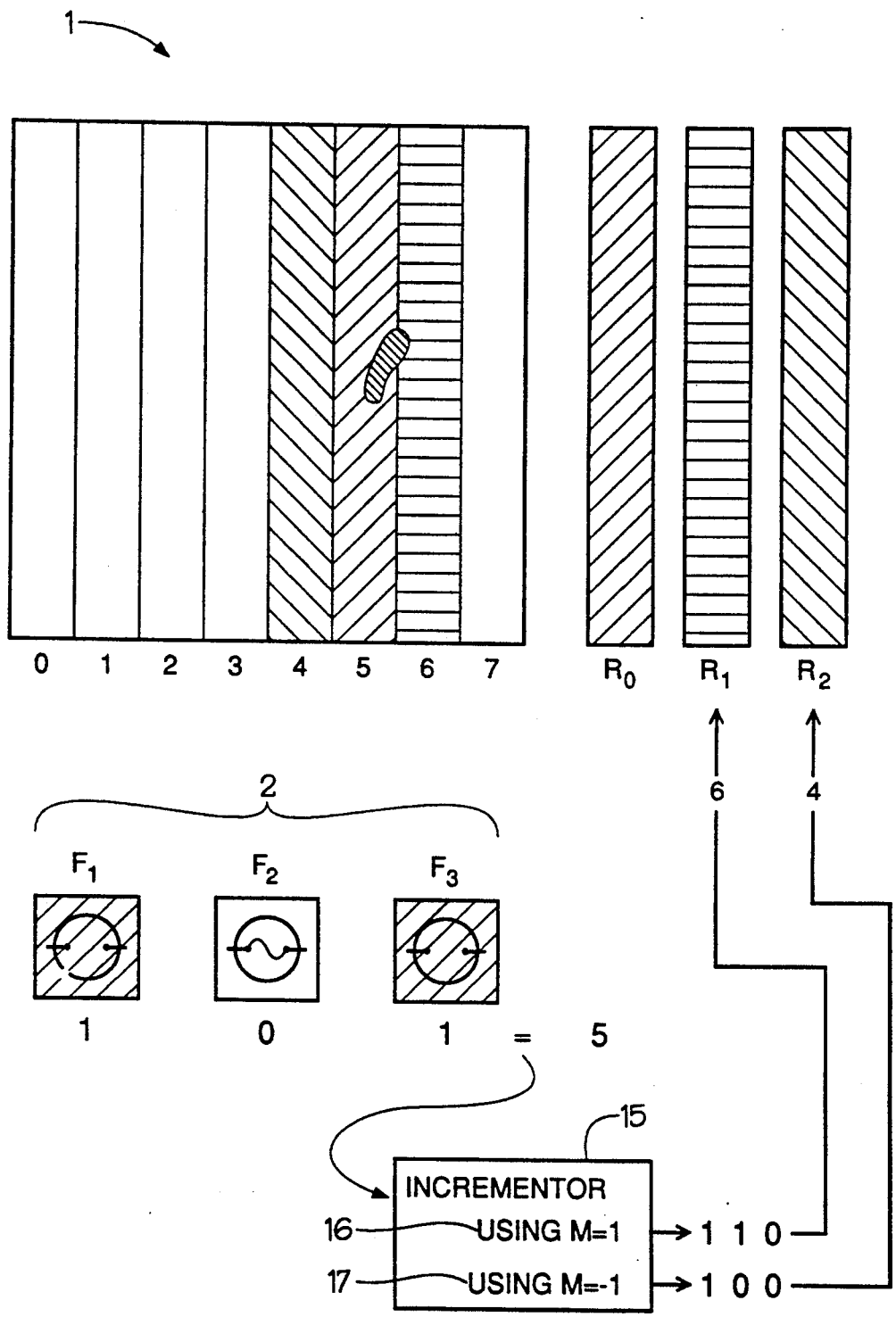
FIG. 6 is a block diagram representing the memory array with a more sophisticated incrementor for replacing all physically adjacent columns.

In no way is the operation of the incrementor restricted to generating only one successive address. If the physical layout of the DRAM requires physically adjacent memory elements to be addressed in a non-successive but predictable manner, the incrementor can be programmed to generate the proper address by adding any factor m to the defective element's address. Also, if there is more than one adjacent element and the means to replace it, as seen in FIG. 6, the incrementor 15 can calculate the first adjacent element by using a factor of $m=1$ 16. The second adjacent element's address, in this case column 4, can be generated using $m=1$ 17. The incrementor merely calculates the address or addresses of those memory elements physically adjacent to the memory element whose address has been sent to the incrementor.

Although all examples have referred to n fuses and an n-bit incrementor, this invention applies to implementations using n-k fuses, replacing sets of $2^{}k$ elements. In this case an n-k bit incrementor would be used to invoke replacement of physically adjacent sets of $2^{}k$ elements.

While the preferred embodiments of the invention have been described, modifications can be made and other embodiments may be devised without departing from the spirit of the invention and the scope of the appended claims.

What is claimed is:

1. A circuit for activating redundant circuits on an integrated circuit chip comprising:
   a plurality of fuses;
   means for logically interpreting the status of said fuse to correspond to an address, said address representing a faulty circuit located on said chip;
   means for calculating a second address corresponding to an adjacent circuit;
   means for enabling circuitry replacing said faulty circuit and said adjacent circuit.

2. The circuit of claim 1 wherein said integrated circuit chip comprises dynamic random access memory.

3. A circuit for activating redundant memory elements on an integerated circuit chip comprising:
   a plurality of fuses;
   means for logically interpreting the status of said
   fuses to correspond to an original address, said original address representing a first memory element;
   means for calculating at least one modified address corresponding to at least one physically adjacent memory element;
   means for replacing said first memory element and said adjacent memory element or elements with redundant memory elements.

4. The circuit of claim 2 wherein said means for calculating comprises:
   means for applying a first modifier to said original address thereby generating a first modified address corresponding to a first physically adjacent memory element.

5. The circuit of claim 4 wherein said first modifier comprises:
   an addend, wherein said addend is any positive or negative integer.

6. The circuit of claim 4 wherein said means for applying comprises:
   an incrementor.

7. The circuit of claim 4 which further comprises:
   means for applying a second modifier to said original address thereby generating a second modified address corresponding to a second physically adjacent memory element,
   said second physically adjacent memory element located physically adjacent to said first memory element within said integerated circuit chip.

8. The circuit of claim 7 wherein said second modifier comprises:
   an addend, wherein said addend is any positive or negative integer.

9. The circuit of claim 7 wherein both of said means for applying comprises:
   at least one incrementor.

10. The circuit of claim 3 wherein each of said memory elements comprises:
    a memory cell.

11. The circuit of claim 3 wherein each of said memory elements comprises:
    a row comprising a plurality of memory cells.

12. The circuit of claim 3 wherein each of said memory elements comprises:
a column comprising a plurality of memory cells.

13. A circuit for activating redundant memory elements on an integrated circuit chip comprising:
a plurality of fuses;
means for logically interpreting the status of said fuses to correspond to an original set of upper significant bits,
said original set of upper significant bits corresponding to a first set of addresses representing a first set of memory elements;
means for calculating at least one modified set of upper significant bits corresponding to a second set of addresses representing a second set of memory elements;
means for replacing said first set of memory elements and said second set of memory elements with redundant memory elements.

14. The circuit of claim 13 wherein each of said memory elements comprises:
a memory cell.

15. The circuit of claim 13 wherein each of said memory elements comprises:
a row comprising a plurality of memory cells.

16. The circuit of claim 13 wherein each of said memory elements comprises:
a column comprising a plurality of memory cells.

* * * * *